US008712252B2

(12) United States Patent
Masuda et al.

(10) Patent No.: US 8,712,252 B2
(45) Date of Patent: Apr. 29, 2014

(54) OPTICAL SIGNAL OUTPUT APPARATUS, ELECTRICAL SIGNAL OUTPUT APPARATUS, AND TEST APPARATUS

(75) Inventors: Shin Masuda, Miyagi (JP); Kazunori Shiota, Miyagi (JP)

(73) Assignee: Advantest Corporation, Tokyo (JP)

( * ) Notice: Subject to any disclaimer, the term of this patent is extended or adjusted under 35 U.S.C. 154(b) by 90 days.

(21) Appl. No.: 13/275,343

(22) Filed: Oct. 18, 2011

(65) Prior Publication Data

US 2012/0177363 A1 Jul. 12, 2012

(30) Foreign Application Priority Data

Jan. 11, 2011 (JP) ................................. 2011-003315

(51) Int. Cl.
*H04B 10/04* (2011.01)
(52) U.S. Cl.
USPC ........... 398/183; 398/192; 398/193; 398/194; 398/196; 398/198; 398/201; 398/135; 398/136; 398/161; 398/160; 398/158; 398/159; 398/16; 356/73.1; 372/32; 372/34; 372/36; 372/38.02; 359/237; 359/238; 359/245; 359/247; 359/248; 385/24; 385/37; 385/27

(58) Field of Classification Search
USPC ......... 398/182, 183, 186, 192, 193, 194, 195, 398/196, 197, 198, 200, 201, 158, 159, 160, 398/161, 33, 38, 25, 26, 27, 16, 135, 136, 398/137, 138, 139; 356/73.1; 372/29, 32, 372/34, 36, 38.02; 359/237, 238, 245, 247, 359/248; 385/24, 37, 27, 31, 39
See application file for complete search history.

(56) References Cited

U.S. PATENT DOCUMENTS

| 5,210,807 | A  | * | 5/1993  | Ames .............................. 385/24  |
| 6,842,587 | B1 | * | 1/2005  | McGhan et al. ............... 398/201 |
| 8,170,384 | B1 | * | 5/2012  | Riza ............................... 385/27 |
| 2003/0189701 | A1 | * | 10/2003 | Franke et al. ................ 356/73.1 |
| 2003/0194240 | A1 | * | 10/2003 | Mollenauer et al. .......... 398/158 |
| 2004/0013429 | A1 | * | 1/2004  | Duelk et al. .................... 398/45 |

(Continued)

FOREIGN PATENT DOCUMENTS

| JP | H07-038188 A | 2/1995 |
| JP | H11-122177 A | 4/1999 |

(Continued)

OTHER PUBLICATIONS

Notice of Office Action for Korean Patent Application No. 10-2011-0116518, issued by the Korean Intellectual Property Office on Jul. 31, 2013.

(Continued)

*Primary Examiner* — Hanh Phan

(57) ABSTRACT

To efficiently apply jitter to an optical signal using a simple configuration, provided is an optical signal output apparatus that outputs an optical pulse pattern signal including jitter, the optical signal generating apparatus comprising a light source section that outputs an optical signal having an optical frequency corresponding to a frequency control signal; an optical modulation section that modulates the optical signal output by the light source section, according to a designated pulse pattern; and an optical jitter generating section that delays an optical signal passed by the optical modulation section according to the optical frequency, to apply jitter to the optical signal.

30 Claims, 7 Drawing Sheets

(56) References Cited

U.S. PATENT DOCUMENTS

| | | | | |
|---|---|---|---|---|
| 2009/0324255 | A1* | 12/2009 | Nakamoto | 398/198 |
| 2011/0206384 | A1* | 8/2011 | Zhou et al. | 398/192 |
| 2012/0269521 | A1* | 10/2012 | Masuda et al. | 398/182 |

FOREIGN PATENT DOCUMENTS

| | | |
|---|---|---|
| JP | 2003-185527 A | 7/2003 |
| JP | 2004-503944 A | 2/2004 |
| JP | 2004-354612 A | 12/2004 |
| JP | 2006-211309 A | 8/2006 |
| JP | 2008-151670 A | 7/2008 |
| JP | 2009-294580 A | 12/2009 |
| JP | 2010-152169 A | 7/2010 |
| KR | 10-0349672 B | 8/2002 |
| WO | 2007/083553 A1 | 7/2007 |

OTHER PUBLICATIONS

Notice of Office Action issued by the Korean Intellectual Property Office for Application No. 10-2011-0116518.

Notice of Rejection issued by the Japanese Patent Office for application No. 2011-003315.

* cited by examiner

OPTICAL SIGNAL OUTPUT APPARATUS, ELECTRICAL SIGNAL OUTPUT APPARATUS, AND TEST APPARATUS

BACKGROUND

1. Technical Field

The present invention relates to an optical signal output apparatus, an electrical signal output apparatus, and a test apparatus.

2. Related Art

Conventionally, when applying jitter to an optical signal, the optical signal and a waveform-modulated signal output from a variable wavelength light source are input to a wavelength converting element, and the wavelength-converted signal output from the wavelength converting element is input to a device that delays this signal by a delay amount corresponding to the wavelength of the wavelength-converted signal, as shown in Patent Document 1, for example.

Patent Document 1: Japanese Patent Application Publication No. 2008-151670

A method using such a waveform converting element, however, has poor efficiency because the conversion efficiency of the wavelength converting element is approximately 10% or less. Furthermore, when modulating the wavelength of the output light from the variable wavelength light source at a high speed, a semiconductor laser whose input current is modulated may be used as the variable wavelength light source, but this results in the intensity being modulated at the same time.

SUMMARY

Therefore, it is an object of an aspect of the innovations herein to provide an optical signal output apparatus, an electrical signal output apparatus, and a test apparatus, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is an optical signal output apparatus that outputs an optical pulse pattern signal including jitter, the optical signal generating apparatus comprising a light source section that outputs an optical signal having an optical frequency corresponding to a frequency control signal; an optical modulation section that modulates the optical signal output by the light source section, according to a designated pulse pattern; and an optical jitter generating section that delays an optical signal passed by the optical modulation section according to the optical frequency, to apply jitter to the optical signal.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
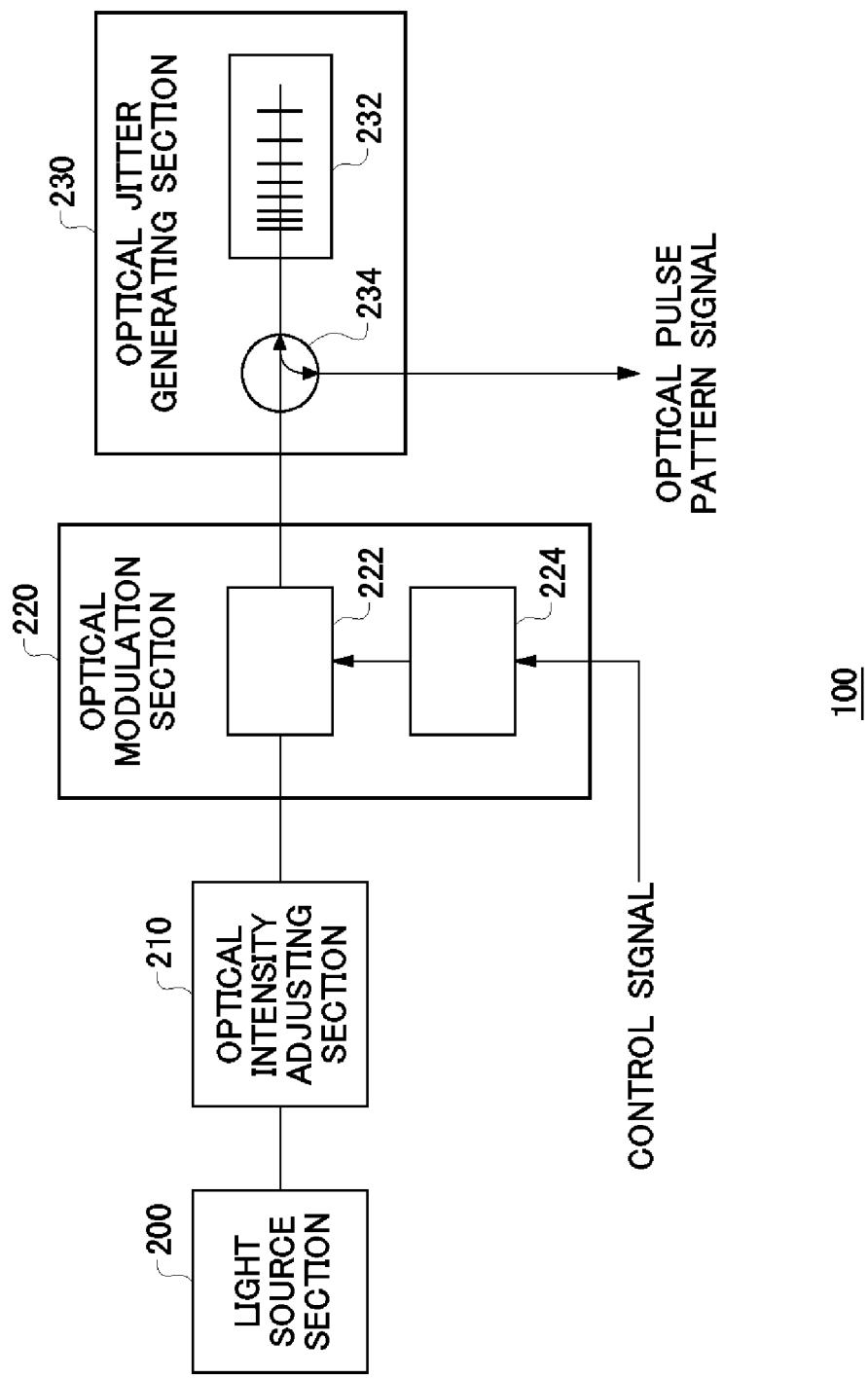
FIG. 1 shows an exemplary configuration of an optical signal output apparatus 100 according to an embodiment of the present invention.

FIG. 1 shows an exemplary configuration of an optical signal output apparatus 100 according to an embodiment of the present invention. The optical signal output apparatus 100 generates light whose optical frequency is changed, and outputs an optical pulse pattern including jitter that corresponds to the optical frequency. Furthermore, the optical signal output apparatus 100 modulates an optical signal in which intensity change caused by change in the optical frequency is restricted, and outputs the resulting optical pulse pattern signal. The optical signal output apparatus 100 includes a light source section 200, an optical intensity adjusting section 210, an optical modulation section 220, and an optical jitter generating section 230.

The light source section 200 outputs an optical signal having an optical frequency corresponding to a frequency control signal. The light source section 200 may transmit the frequency control signal to the optical intensity adjusting section 210.

The optical intensity adjusting section 210 compensates for the intensity change in the optical signal from the light source section 200, and outputs to the optical modulation section 220 an optical signal in which the intensity change caused by change in the optical frequency is restricted.

The optical modulation section 220 modulates the optical signal output by the light source section, according to a designated pulse pattern. The optical modulation section 220 may receive a control signal from the outside and modulate the laser light output from the light source section 200 according to the control signal. The optical modulation section 220 includes an optical modulator 222 and a pattern generator 224.

The optical modulator 222 receives the pulse pattern signal from the pattern generator 224 and modulates the laser light. The optical modulator 222 may output an optical pulse pattern signal. The optical modulator 222 may be an optical modulator that applies an electric field to a ferroelectric crystal such as $LiNbO_3$ (lithium niobate) or material in the PbLaZrTiO family, such as PLZT (lead lanthanum zirconate titanate), to change the refractive index of the ferroelectric crystal such that light passing through the ferroelectric crystal is modulated.

The pattern generator 224 outputs the pulse pattern signal to the optical modulator 222, based on a control signal from the outside. The pattern generator 224 may generate a pattern signal in advance, according to the control signal. Instead, the pattern generator 224 may receive a parameter of the pattern signal, such as an amplitude value, rising edge or falling edge time, pulse width, or duty, and generate the pattern signal according to the received parameter.

The optical jitter generating section 230 delays the optical signal passed through the optical modulation section 220 according to the optical frequency, to apply jitter to the optical signal. The optical jitter generating section 230 includes a grating section 232 and an optical circulator 234.

The grating section 232 includes diffraction grating having a refractive index that periodically changes in a direction in which the light progresses. The grating section 232 may be a fiber Bragg grating. The grating section 232 applies different delay amounts to the input light input from an input end thereof, according to the optical frequency of the input light, and returns the delayed light to the input end thereof. The grating section 232 may include a plurality of fiber gratings formed at different positions in the longitudinal direction.

The grating section 232 includes a plurality of gratings at uniform intervals, thereby forming a Bragg grating. The Bragg grating reflects light in a narrow band centered on the Bragg wavelength, which is obtained as double the product of the refractive index of the optical fiber and the period of the grating. In other words, each fiber grating of the grating section 232 reflects light of a unique wavelength, i.e. optical frequency.

The distance from the input end of the grating section 232 to each fiber grating is different, and therefore the length of the optical path from when light is input at the input end to when the light is returned to be input again at the input end is different according to the optical frequency of the input light. Accordingly, the grating section 232 can apply jitter corresponding to the optical frequency to the optical signal by applying a delay corresponding to the optical frequency of the input optical signal.

Instead, the grating section 232 may be a CFBG (Chirped Fiber Bragg Grating) in which the period of the gratings changes. A CFBG changes the reflection position within the fiber according to the frequency of the light and outputs the resulting light, and therefore the CFBG can apply jitter corresponding to the optical frequency to the optical signal by applying a delay corresponding to the optical frequency of the input optical signal.

The optical circulator 234 inputs the optical pulse pattern signal output from the optical modulation section 220 into the input end of the grating section 232, receives the optical pulse pattern signal to which the jitter is applied output from the input end of the grating section 232, and outputs this received optical pulse pattern signal to the outside as the output light.

In the manner described above, the optical signal output apparatus 100 outputs to the optical intensity adjusting section 210 the laser light having an optical frequency corresponding to jitter to be applied by the light source section 200. The optical intensity adjusting section 210 outputs to the optical modulation section 220 the laser light in which the intensity change caused by a change in the optical frequency of the input laser light is restricted.

The optical modulation section 220 outputs to the optical jitter generating section 230 the optical pulse pattern signal obtained by modulating the input laser light. The optical jitter generating section 230 applies, to the received optical pulse pattern signal, jitter corresponding to the optical frequency of the optical pulse pattern signal, and outputs the resulting signal to the outside. In this way, the optical signal output apparatus 100 can output an optical pulse pattern signal in which the intensity change is restricted, while applying jitter caused by the optical frequency by changing the optical frequency.

The optical signal output apparatus 100 described in the example above includes a plurality of fiber gratings as the optical jitter generating section 230. Instead, the optical jitter generating section 230 may include a dispersive medium having a frequency dispersion value that continuously changes. The optical jitter generating section 230 may be optical fiber having a frequency dispersion value that continuously changes. Such optical fiber causes a delay corresponding to the optical frequency of the optical signal input to the input end thereof, and outputs the delayed optical signal from the output end. Accordingly, in this case, the optical signal output apparatus 100 outputs the output light from the output end of the optical fiber to the outside without using the optical circulator 234.

Instead, the optical jitter generating section 230 may include an arrayed web guide (AWG) that has a plurality of guide paths with different lengths and changes the guide path on which the input light is transmitted according to the optical frequency of the input light. The optical jitter generating section 230 can apply jitter corresponding to the optical frequency, by transmitting the input light on guide paths with different lengths according to the input optical frequency, and output the resulting light.

Figure 2:
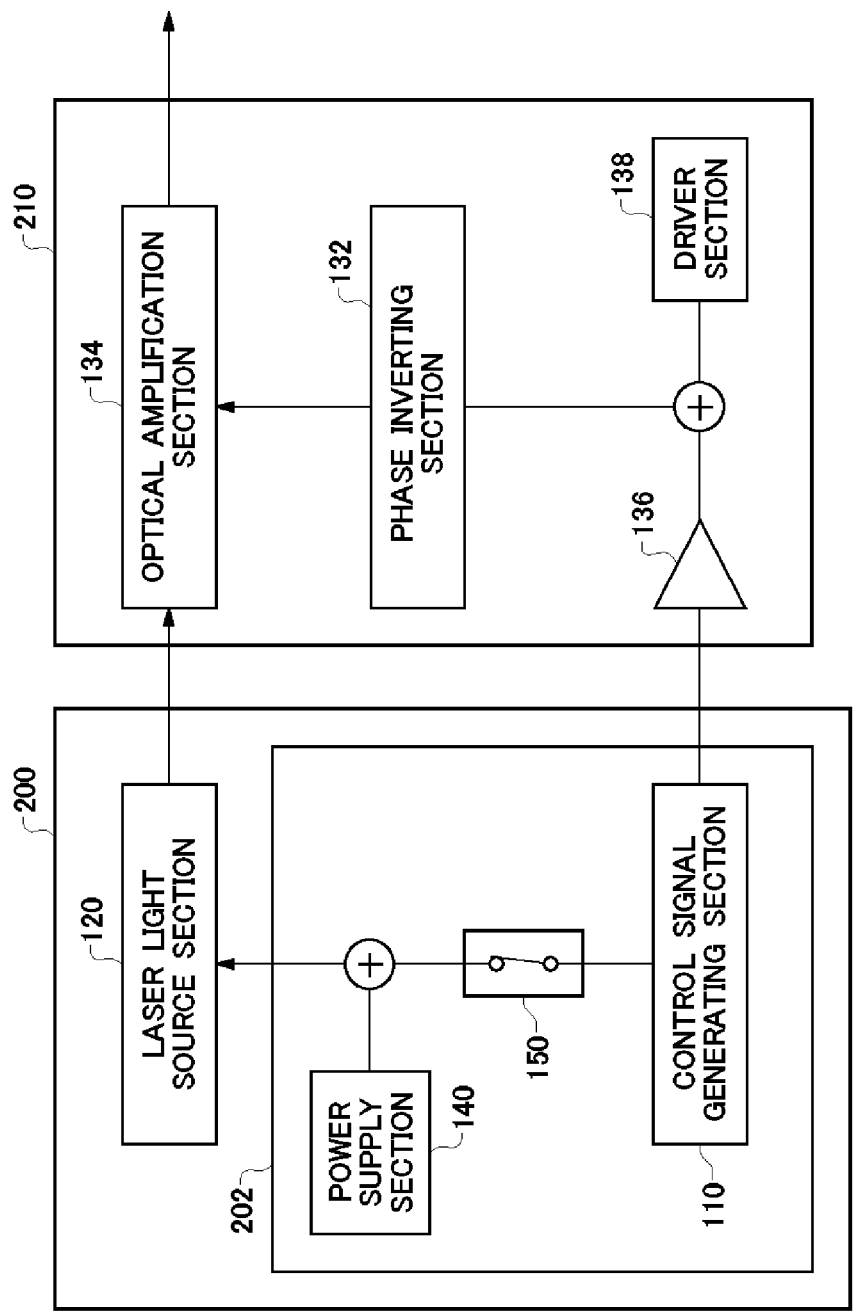
FIG. 2 shows an exemplary configuration of the light source section 200 and the optical intensity adjusting section 210 in the optical signal output apparatus 100 according to the present embodiment.

FIG. 2 shows an exemplary configuration of the light source section 200 and the optical intensity adjusting section 210 in the optical signal output apparatus 100 according to the present embodiment. The light source section 200 includes a laser light source section 120 and a light source driving section 202.

The laser light source section 120 outputs laser light having an optical frequency corresponding to the frequency control signal. The laser light source section 120 may include a semiconductor laser into which is input a drive current that changes according to the frequency control signal. The laser light source section 120 outputs laser light having an optical frequency corresponding to current input thereto. The laser light source section 120 may include a semiconductor laser having a single oscillation mode. For example, the laser light source section 120 may be a DFB (Distributed FeedBack) laser or a DBR (Distributed Bragg Reflector) laser that includes diffraction grating as a reflective surface of a resonator within the device and efficiently emits a wavelength selected by the diffraction grating to operate in a single longitudinal mode.

The light source driving section 202 supplies the drive current for driving the laser light source section 120. The light source driving section 202 includes a control signal generating section 110, a power supply section 140, and a switching section 150.

The control signal generating section 110 outputs a frequency control signal that changes the drive current for driving the laser light source section 120. The control signal generating section 110 controls the optical frequency of the optical output of the laser light source section 120, by outputting the frequency control signal. The control signal generating section 110 may output the frequency control signal as a periodic signal. For example, the control signal generating section 110 may output a sinusoidal signal as the frequency control signal.

The power supply section 140 outputs a drive current for driving the laser light source section 120. The power supply section 140 may output a direct current.

The switching section 150 is provided between the laser light source section 120 and the control signal generating section 110 that outputs the frequency control signal, and switches whether the frequency control signal is supplied to the laser light source section 120. When the switching section 150 is ON, the optical signal output apparatus 100 outputs the optical signal while restricting the intensity change caused by change of the optical frequency. In this case, the laser light source section 120 receives a drive signal obtained by superimposing the frequency control signal output by the control signal generating section 110 onto the drive current output by the power supply section 140, and outputs laser light corresponding to the drive signal.

When the switching section 150 is OFF, the optical intensity adjusting section 210 outputs laser light having optical intensity that is changed according to the frequency control signal. In this case, the control signal generating section 110 does not generate a frequency control signal, and therefore the optical intensity adjusting section 210 can function as a CW light source with a constant intensity. Furthermore, the light source section 200 can function as an intensity-modulated light source as a result of the control signal generating section 110 outputting a periodic modulated signal as the frequency control signal.

The optical intensity adjusting section 210 may amplify the input light with an amplification factor corresponding to the optical intensity change of the input light, to output an optical signal obtained by restricting the intensity change in the optical signal output by the light source section 200. The optical intensity adjusting section 210 may adjust the amplification factor of the input light from the light source section 200 based on the frequency control signal, to output an optical signal obtained by restricting the intensity change of the light source section 200 according to the frequency control signal. The optical intensity adjusting section 210 includes a phase inverting section 132, an optical amplification section 134, a control signal amplifying section 136, and a driver section 138.

The phase inverting section 132 generates an intensity control signal having an inverse phase of the frequency control signal. The phase inverting section 132 may include a phase shift apparatus that shifts the phase of the frequency control signal input thereto to invert the phase of the frequency control signal. If the frequency control signal generated by the control signal generating section 110 is a periodic signal, the phase inverting section 132 can generate the intensity control signal having the inverse phase of the frequency control signal by shifting the phase of the frequency control signal by substantially half of a cycle, for example. The phase shift apparatus may be a phase adjuster that adjusts the phase of an output electrical signal by changing the electrical length of a transmission line on which the electrical signal is transmitted. As another example, the phase shift apparatus may be a delay circuit.

The phase inverting section 132 may include an inverter circuit that inverts the sign of the frequency control signal input thereto. The phase inverting section 132 can generate the intensity control signal having the inverse phase of the frequency control signal by using the inverter circuit, even if the frequency control signal is not periodic. In this case, the phase inverting section 132 may include a phase shift apparatus, and the phase shift apparatus may make fine adjustments to the phase of the intensity control signal that arrives at the optical amplification section 134.

The optical amplification section 134 adjusts the amplification factor of the laser light from the laser light source section 120 based on the frequency control signal to restrict the intensity change of the laser light according to the frequency control signal, and outputs the resulting laser light. The optical amplification section 134 may decrease the amplification factor of the output light according to an increase in the intensity of the input laser light. The optical amplification section 134 includes an optical amplifier that amplifies the laser light received from the laser light source section by an amplification factor corresponding to the intensity control signal output by the phase inverting section 132, and outputs the amplified laser light. The optical amplifier may be a semiconductor optical amplifier that amplifies by an amplification factor corresponding to current input thereto.

The control signal amplifying section 136 amplifies the frequency control signal generated by the control signal generating section 110. The control signal amplifying section 136 amplifies the frequency control signal such that the phase inverting section 132 outputs an intensity control signal having the signal strength that is to be input to the optical amplification section 134 in order for the optical intensity adjusting section 210 to restrict the intensity change of the laser light from the laser light source section 120, and outputs the amplified frequency control signal to the phase inverting section 132. The control signal amplifying section 136 may amplify the frequency control signal with an amplification factor of one or less. The control signal amplifying section 136 may include an amplifier that amplifies an electrical signal or an attenuator that attenuates an electrical signal.

The driver section 138 outputs a drive current of the optical amplification section 134. The driver section 138 may output a direct current. The optical amplification section 134 receives the intensity control signal obtained by superimposing the amplified frequency control signal output by the control signal amplifying section 136 onto the direct current output by the driver section 138 and inverting the phase of the result using the phase inverting section 132.

Figure 3:
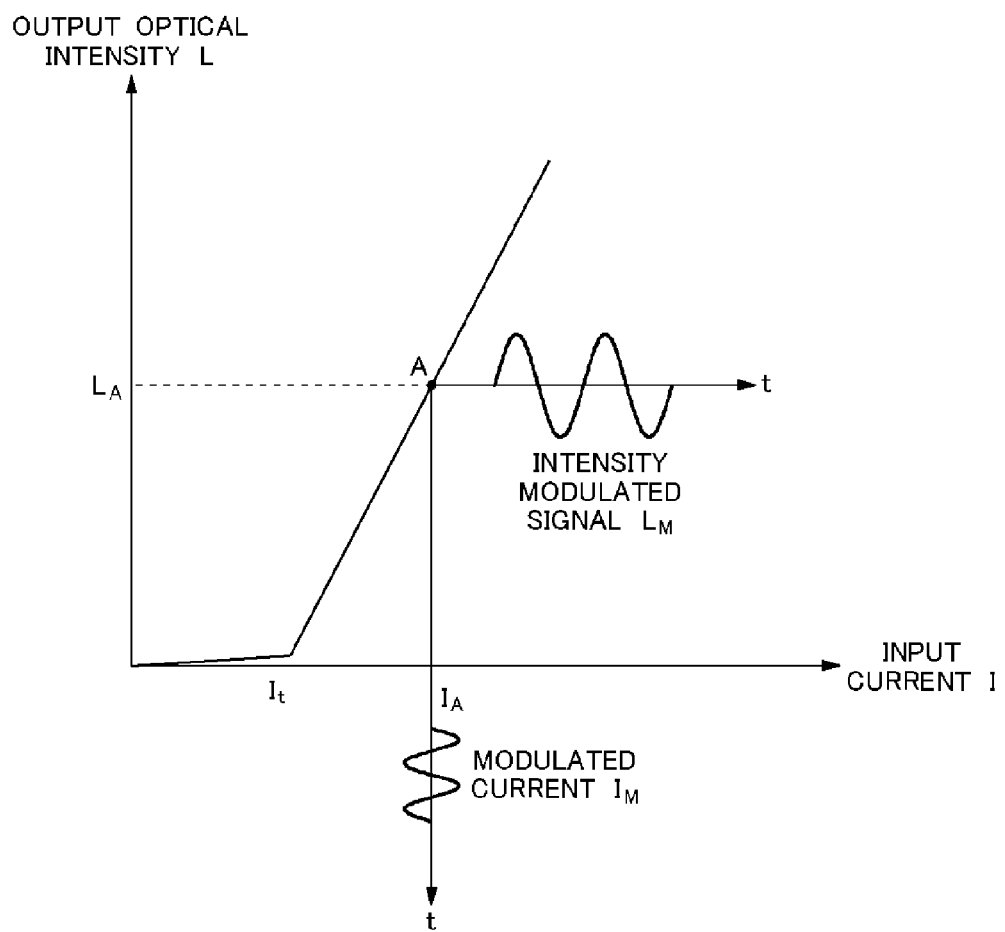
FIG. 3 shows an exemplary characteristic of the output optical intensity L with respect to the input current I of the laser light source section 120, provided in the optical signal output apparatus 100 of the present embodiment.

FIG. 3 shows an exemplary characteristic of the output optical intensity L with respect to the input current I of the laser light source section 120, provided in the optical signal output apparatus 100 of the present embodiment. In FIG. 3, the horizontal axis indicates the current I input to the laser light source section 120, and the vertical axis represents the output optical intensity L of the laser light source section 120.

In the present example, when the input current I exceeds a threshold current $I_t$, the laser light source section 120 performs laser oscillation and outputs laser light. The laser light source section 120 outputs the laser light L having an optical intensity L that is proportional to the input current I.

For example, the power supply section 140 may supply the laser light source section 120 with the drive current $I_A$ having a predetermined constant strength, so that the laser light source section 120 outputs laser light with the optical intensity $L_A$ as shown by point A in FIG. 3. Here, the control signal generating section 110 outputs, as the frequency control signal for controlling the optical frequency, a current signal that changes the drive current $I_A$.

The control signal generating section 110 may output a sinusoidal modulated current $I_M$ and superimpose this current on the drive current $I_A$. In this way, the laser light source section 120 can output laser light whose optical frequency is modulated with a sinusoidal wave. However, by modulating the drive current $I_A$ with the modulated current $I_M$, the laser light source section 120 causes the output optical intensity to also become an intensity modulated signal, such as shown by $L_M$. The optical signal output apparatus 100 of the present embodiment uses the optical intensity adjusting section 210 to compensate for the intensity change in such laser light, thereby restricting the intensity change caused by change in the optical frequency.

Figure 4:
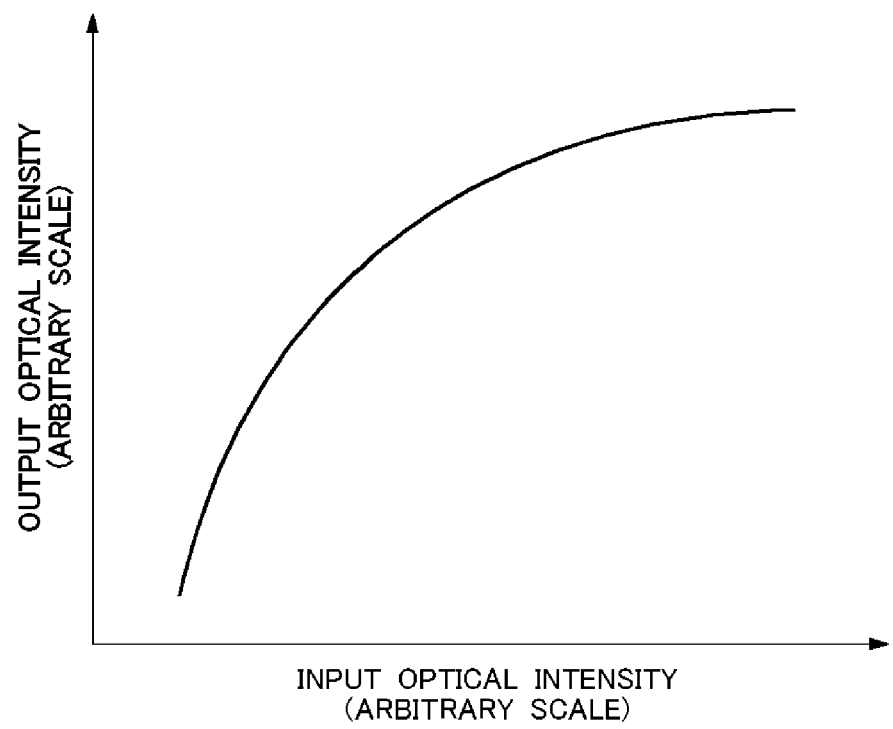
FIG. 4 shows an exemplary characteristic of output optical intensity with respect to input optical intensity of the optical amplification section 134 provided in the optical signal output apparatus 100 according to the present embodiment.

FIG. 4 shows an exemplary characteristic of output optical intensity with respect to input optical intensity of the optical amplification section 134 provided in the optical signal output apparatus 100 according to the present embodiment. In FIG. 4, the horizontal axis indicates the input optical intensity that is input to the optical amplification section 134, and the vertical axis represents the output optical intensity output by the optical amplification section 134.

The optical amplification section 134 may include a low-saturation semiconductor optical amplifier that decreases the amplification factor of the output light according to an increase in the input optical intensity and saturates the amplification factor. As a result, when the intensity modulated signal $L_M$ is input, the optical amplification section 134 amplifies this signal with an amplification factor corresponding to the amplitude of the optical intensity. In other words, the optical amplification section 134 increases the amplification factor in response to a decrease in the amplitude of the optical intensity and decreases the amplification factor in response to an increase in the amplitude of the optical intensity. As a result, the optical amplification section 134 can restrict the intensity change of the intensity modulated signal $L_M$.

Here, the characteristic of the amplification factor of the low-saturation optical amplifier shown in FIG. 4 is approximately translated on the horizontal axis or vertical axis according to the current input to the optical amplification section 134. For example, the optical amplification section 134 increases the input optical intensity that causes the amplification factor to be saturated according to an increase of the input current, and therefore the amplification factor characteristic moves in the positive direction on the horizontal axis. In this case, the optical amplification section 134 increases the optical saturated output intensity according to an increase of the input current, and therefore the amplification factor characteristic moves in the positive direction on the vertical axis.

The optical amplification section 134 decreases the input optical intensity that causes the amplification factor to be saturated according to a decrease of the input current, and therefore the amplification factor characteristic moves in the negative direction on the horizontal axis. In this case, the optical amplification section 134 decreases the saturated optical output according to a decrease of the input current, and therefore the amplification factor characteristic moves in the negative direction on the vertical axis. Accordingly, when the intensity modulated signal $L_M$ is input, the driver section 138 supplies the optical amplification section 134 with an input voltage that causes the optical amplification section 134 to function as a low-saturation amplifier.

When the optical amplification section 134 does not sufficiently fulfill the function of a low-saturation optical amplifier, or when the input optical intensity is not large enough for the optical amplification section 134 to exhibit the saturation effect, so that the restriction of the intensity change is insufficient, the optical signal output apparatus 100 may control the input current of the optical amplification section 134 in a manner to cancel out the intensity change of the input light.

As described in relation to FIG. 3, the intensity change of the input light of the optical amplification section 134 occurs according to the frequency control signal. Accordingly, the optical amplification section 134 can restrict the intensity change caused by change in the optical frequency by changing the amplification factor for the input light, whose optical intensity changes according to the frequency control signal, at timings at an inverse phase of the frequency control signal.

Therefore, the optical signal output apparatus 100 inverts the phase of the frequency control signal output from the control signal generating section 110 using the phase inverting section 132, superimposes the resulting signal on the drive current of the optical amplification section 134 output from the driver section 138, and supplies the resulting signal to the optical amplification section 134 as the intensity control signal. Here, the phase inverting section 132 adjusts the timing at which the intensity control signal reaches the optical amplification section 134 such that the amplification factor of the optical amplification section 134 increases when the optical intensity of the input light decreases according to the frequency control signal and the amplification factor of the optical amplification section 134 decreases when the optical intensity of the input light increases according to the frequency control signal, and supplies the intensity control signal to the optical amplification section 134 at the adjusted timings.

The control signal amplifying section 136 causes the phase inverting section 132 to output the amplitude intensity of the intensity control signal for controlling the amplification factor of the optical amplification section 134 such that the output light of the optical amplification section 134 has a substantially constant optical intensity. For example, the optical signal output apparatus 100 may measure in advance the output light from the optical amplification section 134 and adjust in advance the amplification factor of the frequency control signal used by the control signal amplifying section 136 to achieve constant output light for the optical amplification section 134.

In the present embodiment described above, the optical amplification section 134 includes a low-saturation semiconductor optical amplifier. The optical amplification section 134 may further include an optical fiber amplifier that decreases the amplification factor of the output light according to an increase in the intensity of the input light. For example, an optical fiber amplifier having optical fiber doped with rare earth elements, for example, may have a saturation characteristic that decreases the amplification factor according to an increase in the input light, as described in relation to FIG. 4.

The saturation characteristic of the optical fiber amplifier is approximately translated on the vertical axis or the horizontal axis, as shown in FIG. 4, by adjusting the length of the rare-earth-doped optical fiber or the optical intensity of excitation light for exciting the rare-earth-doped optical fiber. For example, the optical fiber amplifier decreases the optical intensity of the input light that saturates the amplification factor, by decreasing the length of the rare-earth-doped fiber or increasing the length of the rare-earth-doped fiber to be great enough that the amplified light obtained by amplifying the input light absorbs and attenuates itself. Therefore, the amplification factor characteristic moves in the negative direction on the horizontal axis. In this case, the optical fiber amplifying section decreases the saturated output optical intensity, and therefore the amplification characteristic moves in the negative direction on the vertical axis.

Furthermore, the optical fiber amplifier decreases the input optical intensity that causes saturation of the amplification factor according to a decrease of the excitation light intensity, and therefore the amplification factor characteristic moves in the negative direction on the horizontal axis. In this case, the optical fiber amplifying section also decreases the saturated output optical intensity, and therefore the amplification factor characteristic moves in the negative direction on the vertical axis.

The optical fiber amplifier increases the input optical intensity that causes saturation of the amplification factor according to an increase of the excitation light intensity, and therefore the amplification factor characteristic moves in the positive direction on the horizontal axis. In this case, the optical fiber amplifier also increases the saturated output optical intensity, and therefore the amplification factor characteristic moves in the positive direction on the vertical axis.

Accordingly, the optical signal output apparatus 100 may set in advance an optical intensity for the excitation light that excites the rare-earth-doped fiber and a length of the rare-earth-doped fiber that cause the optical amplification section 134 to function as a low-saturation amplifier for the intensity modulated signal $L_M$ input thereto. As a result, when the semiconductor optical amplifier cannot restrict the intensity change caused by a change in the optical frequency, the optical amplifying section 134 can restrict the intensity change of the laser light output by the semiconductor optical amplifier and output the resulting laser light.

In the manner described above, the optical signal output apparatus 100 may output laser light in which the intensity change caused by change of the optical frequency is restricted, by including a plurality of optical amplifiers. Furthermore, the optical signal output apparatus 100 may include a plurality of optical fiber amplifiers.

The optical signal output apparatus 100 according to the present embodiment described above can output laser light in which the intensity change caused by a change in the optical frequency is restricted, even when the modulation width of the optical frequency is increased such that the optical intensity change increases, by using the low-saturation characteristics of a plurality of optical amplifiers. Furthermore, the optical amplification section 134 may restrict the intensity change caused by change in the optical frequency by including a plurality of optical fiber amplifiers, without including a semiconductor optical amplifier.

The optical signal output apparatus 100 of the present embodiment described above can output to the optical modulation section 220 laser light in which the intensity change caused by change in the optical frequency is restricted, by causing the optical amplification section 134 to function as a low-saturation amplifier and/or changing the amplification factor of the optical amplification section 134 according to the intensity change of the input light.

As a result, the optical signal output apparatus 100 can output to the optical jitter generating section 230 an optical pulse pattern signal that is an optical signal in which the intensity change caused by change in the optical frequency is restricted while the optical frequency is changed according to the frequency control signal. Furthermore, the optical signal output apparatus 100 can apply, to the optical pulse pattern signal, jitter corresponding to the optical frequency of the optical pulse pattern signal, and output the resulting signal to the outside. In other words, the optical signal output apparatus 100 can generate an optical pulse pattern signal to which is applied jitter corresponding to the frequency control signal.

In this way, the optical signal output apparatus 100 can generate an optical pulse pattern signal including jitter without using a complicated feedback circuit. Accordingly, the jitter applied by the optical signal output apparatus 100 is not limited by the feedback circuit, and therefore the optical signal output apparatus 100 can generate jitter corresponding to one cycle of the optical pulse pattern signal, for example, and apply this jitter to the optical signal.

The light source section 200 can function as a CW light source by turning OFF the switching section 150. Furthermore, the optical signal output apparatus 100 can function as an intensity modulated light source by turning OFF the switching section 150 and outputting the frequency control signal of the control signal generating section 110 as a periodic modulated signal. The optical signal output apparatus 100 may generate a CW light source in which the optical frequency from the light source section 200 is constant, to output an optical pulse pattern signal that does not include jitter, by stopping the generation of the frequency control signal from the control signal generating section 110.

The optical signal output apparatus 100 of the present embodiment described above is an example in which an optical pulse pattern signal including jitter is generated. Here, the optical signal output apparatus 100 may function as an electrical signal generating apparatus that outputs an electrical signal including jitter, by further including a photoelectric converter that converts the optical signal including optical jitter generated by the optical signal output apparatus 100 into an electrical signal. In this way, the optical signal output apparatus 100 can generate a pulse pattern signal including jitter without being affected by the band limitation of a feedback circuit.

Figure 5:
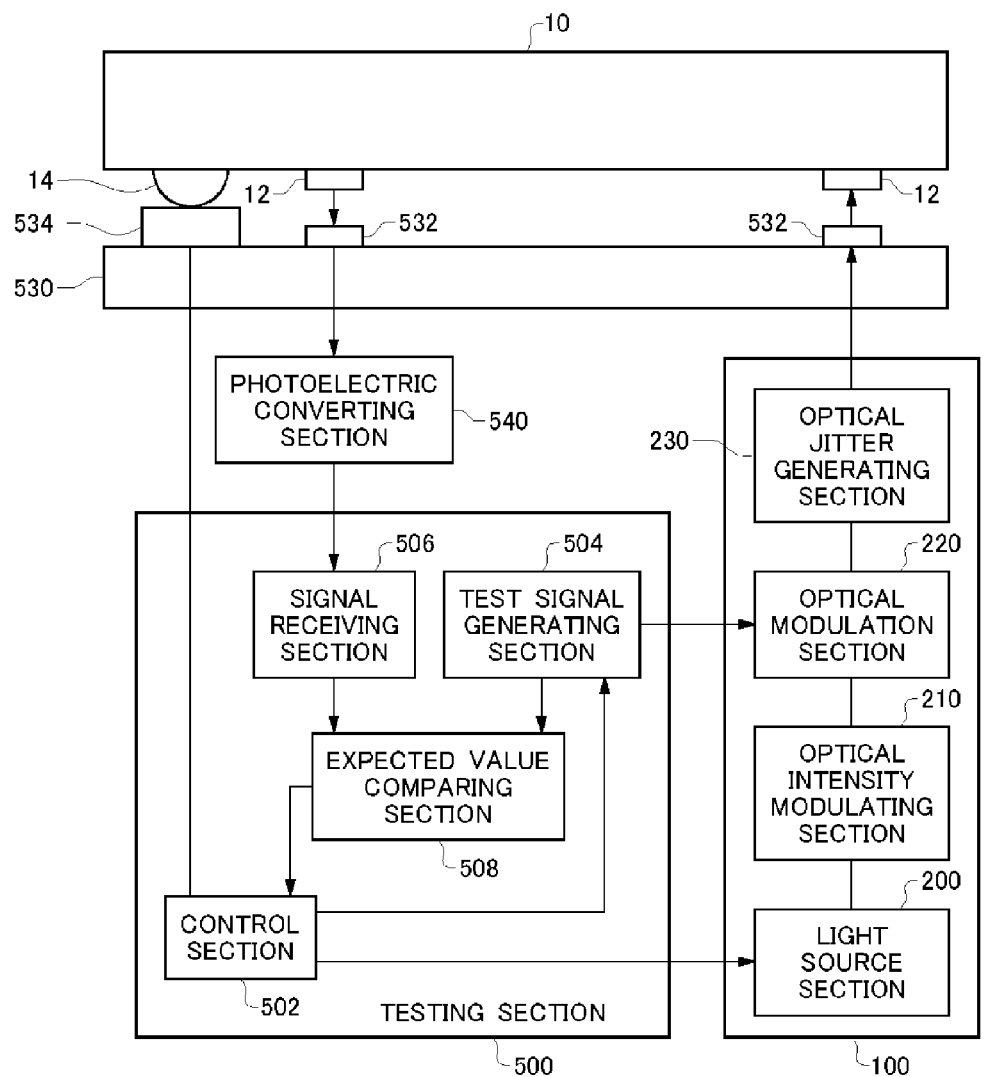
FIG. 5 shows an exemplary configuration of a test apparatus 1000 according to the present embodiment, along with a device under test 10.

FIG. 5 shows an exemplary configuration of a test apparatus 1000 according to the present embodiment, along with a device under test 10. In the test apparatus 1000 of the present embodiment, components that are substantially the same as those in the optical signal output apparatus 100 described in FIGS. 1 and 2 are given the same reference numerals and description thereof is omitted. The test apparatus 1000 tests a device under test 10 having an optical interface, and the device under test 10 may be an analog circuit, a digital circuit, a memory, or a system on chip (SOC), for example.

The device under test 10 may be a circuit resulting from a combination of an optical interface and at least one of an analog circuit, a digital circuit, a memory, and a system on chip (SOC), for example. The device under test 10 includes one or more optical input/output sections 12 that exchange optical signals. The device under test 10 may also include one or more input/output terminals 14 that exchange optical signals. The input/output terminal 14 may be a solder bump, a land, or a connector, for example.

The test apparatus 1000 supplies an optical input/output section 12 of the device under test 10 with an optical test signal, receives an electrical response signal resulting from the photoelectric conversion of an optical response signal output from an optical input/output section 12 of the device under test 10, and judges pass/fail of the device under test 10 by comparing the electrical response signal to an expected value. The test apparatus 1000 may supply the input/output terminal 14 of the device under test 10 with a control signal that controls the supply of power to the device under test 10 or the starting and stopping of the testing, for example. The test apparatus 1000 includes the optical signal output apparatus 100, a testing section 500, an optical interface 530, and a photoelectric converter 540.

The optical signal output apparatus 100 outputs an optical test signal for testing the device under test 10. The optical signal output apparatus 100 outputs an optical pulse pattern signal that includes jitter corresponding to change in the optical frequency while restricting the intensity change caused by change of the optical frequency. The optical signal output apparatus 100 may output the optical signal according to a test start signal of the testing section 500, and may stop the supply of the laser light according to a test stop signal of the testing section 500.

The optical modulation section 220 of the optical signal output apparatus 100 may receive the test signal from the testing section 500 and modulate the laser light output by the optical intensity adjusting section 210 in which the intensity change caused by change of the optical frequency is restricted, according to the test signal. The optical signal output apparatus 100 outputs the optical pulse pattern signal including jitter to the optical interface 530.

The optical interface 530 transmits the optical test signal output by the optical signal output apparatus 100 to an optical input section of the device under test 10, receives the optical response signal output by the device under test 10, and outputs the received optical response signal. The device under test 10 is mounted on the optical interface 530. For example, the device under test 10 may be fixed to the optical interface 530 via adhesion. The optical interface 530 transmits the optical pulse pattern signal, which is received as the optical test signal, to an optical input/output section 12 of the device under test 10. The optical interface 530 receives the optical response signal output by the device under test 10 from an optical input/output section 12.

The optical interface 530 may include a number of optical input/output sections 532 greater than or equal to the number of optical input/output sections 12 of the device under test 10. The optical interface 530 may further include a number of input/output terminals 534 greater than or equal to the number of input/output terminals 14 of the device under test 10, if testing is performed by exchanging electrical signals with the device under test 10.

The optical input/output section 532 exchanges optical signals with the device under test 10. The optical input/output section 532 may output the optical signal as a light beam that propagates through space, using a lens, a prism, and/or a half mirror, for example. Instead, the optical input/output section 532 may pass an optical signal by arranging the output end of the optical transmission path near the optical input/output section 12 of the device under test 10 or in contact with the optical input/output section 12.

The optical input/output section 532 may include a collimating lens at the output end of the optical transmission path to exchange optical signals with the optical input/output section 12 of the device under test 10. If the optical input/output section 12 is a connector, the optical input/output section 532 may be a connector that engages with the optical input/output section 12.

The input/output terminal 534 is electrically connected to the input/output terminal 14 of the device under test 10 and exchanges electrical signals with the input/output terminal 14. The input/output terminal 534 may supply the device under test 10 with a clock having a low frequency relative to the optical test signal, a control signal indicating start, stop, or interrupt of testing, and/or a power supply.

The input/output terminal 534 may be a probe, a cantilever, a membrane bump, or a terminal directly contacting the input/output terminal 14 of the device under test 10, for example. If the input/output terminal 14 is a connector, the input/output terminal 534 may be a connector that engages with the input/output terminal 14.

The photoelectric converter 540 converts the optical response signal output by the optical interface 530 into an electrical response signal, and transmits the response signal to the testing section 500. For example, the photoelectric converter 540 may convert the optical response signal into the response signal using a photodiode. Instead, the photoelectric converter 540 may be an image sensor such as a CCD. In this case, the photoelectric converter 540 may receive a plurality of optical response signals via a plurality of optical transmission paths, and convert the optical response signals into a plurality of response signals.

The testing section 500 outputs the test signal, receives the response signal corresponding to the test signal, and compares the response signal to an expected value. For example, the testing section 500 may acquire a test program used for testing from an external computer, such as a work station, or storage apparatus, or acquire a test program that is input by a user, and output the test signal by executing this program. The testing section 500 includes a control section 502, a test signal generating section 504, a signal receiving section 506, and an expected value comparing section 508.

The control section 502 executes the test program by transmitting a control signal indicating the operational timing of the apparatuses of the test apparatus 1000. The control section 502 may receive the test results and display the test results to the user, or may transmit the test results to be stored in an external computer or storage apparatus.

The test signal generating section 504 generates a test signal for testing the device under test 10. The test signal generating section 504 generates the test signal to be used for the optical signal test based on test pattern data or a test sequence designated by the test program, for example. The test signal generating section 504 may transmit a parameter of the pulse pattern signal to the optical modulation section 220, for example. The test signal generating section 504 may generate an expected value for the response signal output by the device under test 10 in response to the test signal, and transmit the expected value to the expected value comparing section 508.

The signal receiving section 506 receives the response signal transmitted by the photoelectric converter 540. The signal receiving section 506 transmits the received signal to the expected value comparing section 508.

The expected value comparing section 508 compares the signal received by the signal receiving section 506 to the expected value. The expected value comparing section 508 receives the expected value from the test signal generating section 504. The control section 502 may judge pass/fail of the device under test 10 based on the comparison result of the expected value comparing section 508.

The test apparatus 1000 of the present embodiment described above can perform optical testing by transmitting an optical test signal to which jitter has been applied to a device under test including an optical input/output section 12, and receiving a response signal corresponding to the optical test signal. Furthermore, the test apparatus 1000 can perform this optical testing by combining the testing section 500 that performs testing using electrical signals with the optical signal output apparatus 100, the optical interface 530, and the photoelectric converter 540.

Figure 6:
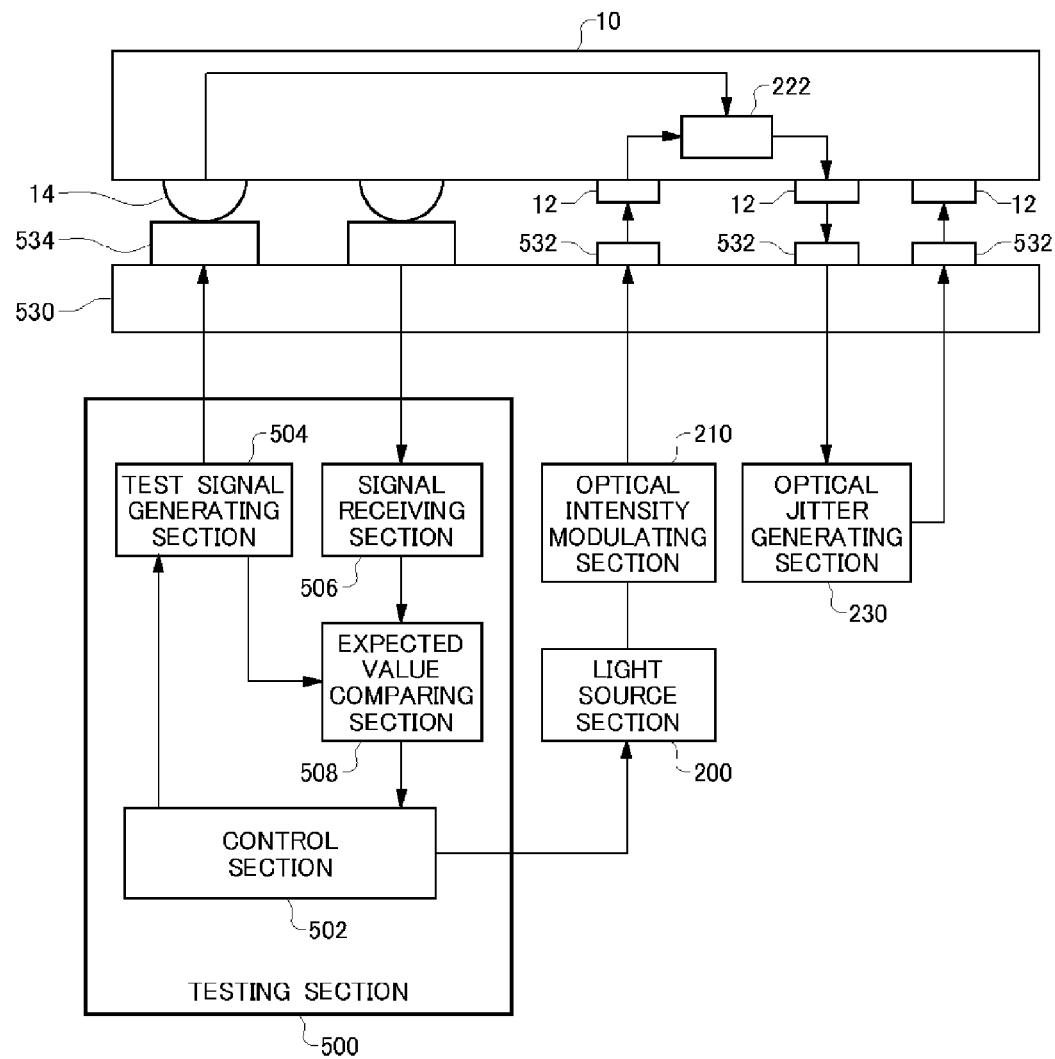
FIG. 6 shows a first modification of the test apparatus 1000 according to the present embodiment, along with the device under test 10.

FIG. 6 shows a first modification of the test apparatus 1000 according to the present embodiment, along with the device under test 10. Components of the test apparatus 1000 of the present modification that are substantially the same as those of the test apparatus 1000 shown in FIG. 5 are given the same reference numerals, and descriptions thereof are omitted. The test apparatus 1000 tests a device under test 10 including an optical modulator 222 that modulates an input optical signal according to a designated pulse pattern. The test apparatus 1000 includes a light source section 200, an optical intensity adjusting section 210, an optical jitter generating section 230, a testing section 500, and an optical interface 530.

The light source section 200 outputs to the optical modulator 222 of the device under test 10 an optical signal having an optical frequency corresponding to the frequency control signal. The light source section 200 outputs laser light having an optical frequency corresponding to the frequency control signal to the optical intensity adjusting section 210, according to a control signal received from the testing section 500. The optical intensity adjusting section 210 restricts the intensity change corresponding to the frequency control signal of the laser light output by the light source section 200, and outputs the resulting optical signal to the optical interface 530.

The optical interface 530 transmits the optical signal output by the light source section 200 to the optical input section of the device under test 10. In other words, the optical interface 530 receives the optical signal output by the optical intensity adjusting section 210, and transmits this optical signal to the optical input/output section 12 of the device under test 10 via the optical input/output section 532.

The device under test 10 modulates the received optical signal using an optical modulator 222 contained therein, and outputs the resulting optical signal from the optical input/output section 12. The optical modulator 222 may modulate the optical signal according to a control signal received from the outside. The optical modulator 222 may output, as the optical test signal, the optical pulse pattern signal obtained by modulating the received optical signal. The optical interface 530 receives the optical signal output by the device under test 10, and outputs this optical signal to the optical jitter generating section 230.

The optical jitter generating section 230 applies jitter corresponding to the optical frequency to the optical test signal passed by the optical modulator 222, by delaying the optical test signal according to the optical frequency. The optical jitter generating section 230 transmits the optical test signal including jitter to the optical interface 530. The optical interface 530 transmits the optical signal output by the optical jitter generating section 230 to the optical input section of the device under test 10. In other words, the optical interface 530 receives the optical test signal output by the optical jitter generating section 230 and transmits this optical test signal to the optical input/output section 12 of the device under test 10 via the optical input/output section 532.

The test signal generating section 504 of the testing section 500 transmits an electrical test signal to the device under test 10 via the optical interface 530. The test signal generating section 504 may include a pulse pattern generator and transmit a pulse pattern signal to the device under test 10. The device under test 10 transmits the received pulse pattern signal to the optical modulator 222. The optical modulator 222 modulates the optical signal input thereto, according to the received pulse pattern signal.

The test apparatus 1000 of the present modification described above can perform an optical loop-back test, which involves applying jitter to the optical test signal generated by the optical modulation section 220 of the device under test 10 and then returning this signal to the device under test 10. The testing section 500 may receive the results of the optical loop-back test as an electrical signal, via the optical interface 530. The test apparatus 1000 can perform such optical testing by combining the testing section 500 that performs testing with electrical signals with the light source section 200, the optical intensity adjusting section 210, the optical jitter generating section 230, and the optical interface 530.

Figure 7:
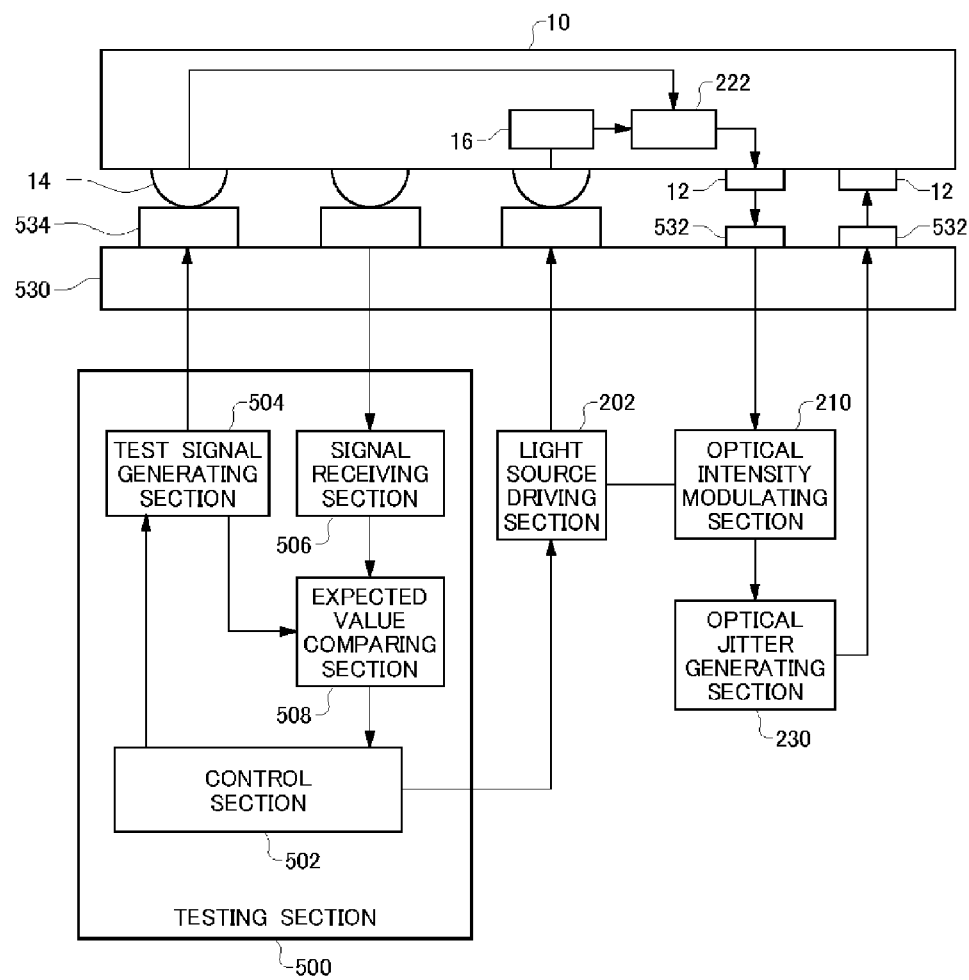
FIG. 7 shows a second modification of the test apparatus 1000 according to the present embodiment, along with the device under test 10.

FIG. 7 shows a second modification of the test apparatus 1000 according to the present embodiment, along with the device under test 10. Components of the test apparatus 1000 of the present modification that are substantially the same as those of the test apparatus 1000 shown in FIGS. 5 and 6 or the optical signal output apparatus in FIGS. 1 and 2 are given the same reference numerals, and descriptions thereof are omitted. The test apparatus 1000 tests a device under test 10 including a device light source 16 and an optical modulator 222 that modulates an input optical signal according to a designated pulse pattern. The device under test 10 may include a device light source 16 that is substantially the same as the laser light source section 120.

The test apparatus 1000 includes a light source driving section 202, an optical intensity adjusting section 210, an optical jitter generating section 230, a testing section 500, and an optical interface 530. The light source driving section 202 applies a modulated drive current to the device light source 16, such that the device light source 16 outputs an optical signal having an optical frequency corresponding to the frequency control signal. The light source driving section 202 may supply the device light source 16, via the optical interface 530, with a drive signal obtained by superimposing the frequency control signal on the drive current. The light source driving section 202 may supply the optical intensity adjusting section 210 with the frequency control signal.

The device light source 16 outputs to the optical modulator 222 of the device under test 10 the optical signal having an optical frequency corresponding to the frequency control signal. The optical modulator 222 may modulate the optical signal according to a control signal received from the outside. The optical modulator 222 transmits the optical pulse pattern signal obtained by modulating the input optical signal to the optical interface 530, as the optical test signal.

The optical interface 530 receives the optical test signal output by the device under test 10 and outputs the received optical test signal to the optical intensity adjusting section 210. The optical intensity adjusting section 210 restricts the intensity change corresponding to the optical frequency of the optical pulse pattern signal output from the device under test 10, and transmits the resulting signal to the optical jitter generating section 230. The optical intensity adjusting section 210 may restrict the intensity change corresponding to the optical frequency of the optical pulse pattern signal based on the frequency control signal received from the light source driving section 202.

The optical jitter generating section 230 delays the optical test signal output by the optical modulator 222, as a result of modulating the optical signal from the device light source 16, by a delay amount corresponding to the optical frequency, thereby applying jitter corresponding to the optical frequency to the optical test signal. The optical jitter generating section 230 transmits the optical test signal including jitter to the optical interface 530.

The optical interface 530 transmits optical test signals output by the optical jitter generating section 230 to each of a plurality of optical input sections of the device under test 10. The test apparatus 1000 of the present modification described above can perform the optical loop-back test, which involves applying jitter to the optical test signal generated by the optical modulation section 220 and the device light source 16 of the device under test 10 and then returning the resulting signal to the device under test 10.

The testing section 500 may receive the results of the optical loop-back test as an electrical signal, via the optical interface 530. The test apparatus 1000 can perform such optical testing by combining the testing section 500 that performs testing with an electrical signal with the light source driving section 202, the optical intensity adjusting section 210, the optical jitter generating section 230, and the optical interface 530.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. An optical signal output apparatus that outputs an optical pulse pattern signal including jitter, the optical signal generating apparatus comprising:
a light source section that outputs an optical signal having an optical frequency corresponding to a frequency control signal;
an optical modulation section that modulates the optical signal output by the light source section, according to a designated pulse pattern;
an optical jitter generating section that delays an optical signal passed by the optical modulation section according to the optical frequency, to apply jitter to the optical signal; and
an optical intensity adjusting section that compensates for optical intensity change of the optical signal from the light source section and outputs an optical signal in which intensity change caused by change of the optical frequency is restricted, wherein
the optical intensity adjusting section adjusts an amplification factor of the input light from the light source section, based on the frequency control signal, to restrict optical intensity change of the optical signal output by the light source section according to the frequency control signal, and outputs the resulting optical signal.

2. The optical signal output apparatus according to claim 1, wherein
the light source section includes a semiconductor laser into which is input drive current that is changed according to the frequency control signal.

3. The optical signal output apparatus according to claim 1, wherein
the optical intensity adjusting section includes a semiconductor optical amplifier that amplifies with an amplification factor corresponding to current input thereto.

4. The optical signal output apparatus according to claim 1, wherein
the optical intensity adjusting section includes an optical fiber amplifier that decreases the amplification rate of light output therefrom according to an increase in intensity of light input thereto.

5. The optical signal output apparatus according to claim 1, wherein
the optical jitter generating section includes a diffraction grating having a refractive index that changes periodically in a direction in which light proceeds.

6. The optical signal output apparatus according to claim 5, wherein
the optical jitter generating section includes a fiber Bragg grating.

7. The optical signal output apparatus according to claim 1, wherein
the optical jitter generating section includes a dispersive medium having a frequency dispersion value that changes continuously.

8. An electrical signal output apparatus that outputs a pulse pattern signal including jitter, the electrical signal output apparatus comprising:
the optical signal output apparatus according to claim 1 that outputs the optical pulse pattern signal including jitter; and
a photoelectric converter that converts the optical signal output by the optical signal output apparatus into an electrical signal.

9. A test apparatus that tests a device under test, comprising:
the optical signal output apparatus according to claim 1 that outputs an optical test signal for testing the device under test;
an optical interface that transmits the optical test signal output by the optical signal output apparatus to an optical input section of the device under test, receives an optical response signal output by the device under test, and outputs the optical response signal;
a photoelectric converter that converts the optical response signal output by the optical interface into an electrical response signal; and
a signal receiving section that receives the response signal transmitted by the photoelectric converter.

10. A test apparatus that tests a device under test including an optical modulation section that modulates an input optical signal according to a designated pulse pattern, the test apparatus comprising:
a light source section that outputs an optical signal having an optical frequency corresponding to a frequency control signal;
an optical intensity adjusting section that compensates for optical intensity change of the optical signal from the light source section and outputs, to the optical modulation section of the device under test, an optical signal in which intensity change caused by change of the optical frequency is restricted;
an optical jitter generating section that delays the optical test signal passed by the optical modulation section by a delay amount corresponding to the optical frequency, to apply jitter corresponding to the optical frequency to the optical test signal; and
an optical interface that transmits a plurality of optical signals output by the light source section and the optical jitter generating section to optical input sections of the device under test, receives an optical signal output by the device under test, and outputs the received optical signal, wherein
the optical intensity adjusting section adjusts an amplification factor of the optical signal from the light source section, based on the frequency control signal, to restrict optical intensity change of the optical signal output by the light source section according to the frequency control signal, and outputs the resulting optical signal.

11. A test apparatus that tests a device under test including a device light source and an optical modulation section for modulating an optical signal input thereto according to a designated pulse pattern, the test apparatus comprising:
a light source driving section that applies a modulated drive current to the device light source, such that the device light source outputs an optical signal having an optical frequency corresponding to a frequency control signal;
an optical intensity adjusting section that receives, from the optical modulating section, an optical test signal obtained as a result of the modulating by the optical modulation section, compensates for optical intensity change of the received optical test signal and outputs an optical test signal in which intensity change caused by change of the optical frequency is restricted;

an optical jitter generating section that delays the optical test signal output by the optical intensity adjusting section, according to the optical frequency, to apply jitter corresponding to the optical frequency to the optical test signal output by the optical intensity adjusting section; and an optical interface that transmits the plurality of optical test signals output by the optical jitter generating section to optical input sections of the device under test, receives the optical test signal output by the device under test, and outputs the received optical test signal, wherein the optical intensity adjusting section adjusts an amplification factor of the optical test signal from the optical modulation section, based on the frequency control signal, to restrict optical intensity change of the optical test signal output by the optical modulation section according to the frequency control signal, and outputs the resulting optical signal.

12. An optical signal output apparatus that outputs an optical pulse pattern signal including jitter, the optical signal generating apparatus comprising:

a light source section that outputs an optical signal having an optical frequency corresponding to a frequency control signal;

an optical intensity adjusting section that compensates for optical intensity change of the optical signal from the light source section and outputs an optical signal in which intensity change caused by change of the optical frequency is restricted;

an optical modulation section that modulates the optical signal output by the optical intensity adjusting section, according to a designated pulse pattern;

an optical jitter generating section that delays an optical signal passed by the optical modulation section according to the optical frequency, to apply jitter to the optical signal; and wherein the optical intensity adjusting section amplifies input light with an amplification factor corresponding to an intensity control signal having an inverse phase of the frequency control signal, and outputs the resulting optical signal.

13. An electrical signal output apparatus that outputs a pulse pattern signal including jitter, the electrical signal output apparatus comprising:

the optical signal output apparatus according to claim 12 that outputs the optical pulse pattern signal including jitter; and a photoelectric converter that converts the optical signal output by the optical signal output apparatus into an electrical signal.

14. A test apparatus that tests a device under test, comprising:

the optical signal output apparatus according to claim 12 that outputs an optical test signal for testing the device under test;

an optical interface that transmits the optical test signal output by the optical signal output apparatus to an optical input section of the device under test, receives an optical response signal output by the device under test, and outputs the optical response signal;

a photoelectric converter that converts the optical response signal output by the optical interface into an electrical response signal; and a signal receiving section that receives the response signal transmitted by the photoelectric converter.

15. An optical signal output apparatus that outputs an optical pulse pattern signal including jitter, the optical signal generating apparatus comprising:

a light source section that outputs an optical signal having an optical frequency corresponding to a frequency control signal;

an optical modulation section that modulates the optical signal output by the light source section, according to a designated pulse pattern;

an optical jitter generating section that delays an optical signal passed by the optical modulation section according to the optical frequency, to apply jitter to the optical signal; and a switching section that switches whether the optical frequency of the optical signal output by the light source section corresponds to the frequency control signal.

16. The optical signal output apparatus according to claim 15, further comprising an optical intensity adjusting section that compensates for optical intensity change of the optical signal from the light source section and outputs an optical signal in which intensity change caused by change of the optical frequency is restricted.

17. The optical signal output apparatus according to claim 16, wherein the optical intensity adjusting section amplifies input light with an amplification factor corresponding to optical intensity change of the input light to restrict optical intensity change of the optical signal output by the light source section, and outputs the resulting optical signal.

18. The optical signal output apparatus according to claim 15, wherein the light source section includes:

a laser light source section that outputs laser light having an optical frequency corresponding to the frequency control signal; and a light source driving section that drives the laser light source section, the light source driving section including a control signal generating section that outputs the frequency control signal, and the switching section is provided between the laser light source section and the control signal generating section.

19. The optical signal output apparatus according to claim 15, wherein the light source section includes a semiconductor laser into which is input drive current that is changed according to the frequency control signal.

20. The optical signal output apparatus according to claim 15, wherein the optical jitter generating section includes a diffraction grating having a refractive index that changes periodically in a direction in which light proceeds.

21. The optical signal output apparatus according to claim 20, wherein the optical jitter generating section includes a fiber Bragg grating.

22. The optical signal output apparatus according to claim 15, wherein the optical jitter generating section includes a dispersive medium having a frequency dispersion value that changes continuously.

23. An electrical signal output apparatus that outputs a pulse pattern signal including jitter, the electrical signal output apparatus comprising:

the optical signal output apparatus according to claim 15 that outputs the optical pulse pattern signal including jitter; and a photoelectric converter that converts the optical signal output by the optical signal output apparatus into an electrical signal.

24. A test apparatus that tests a device under test, comprising:

the optical signal output apparatus according to claim 15 that outputs an optical test signal for testing the device under test;

an optical interface that transmits the optical test signal output by the optical signal output apparatus to an optical input section of the device under test, receives an optical response signal output by the device under test, and outputs the optical response signal;

a photoelectric converter that converts the optical response signal output by the optical interface into an electrical response signal; and a signal receiving section that receives the response signal transmitted by the photoelectric converter.

25. A test apparatus that tests a device under test including an optical modulation section that modulates an input optical signal according to a designated pulse pattern, the test apparatus comprising:

a light source section that outputs an optical signal having an optical frequency corresponding to a frequency control signal;

an optical intensity adjusting section that compensates for optical intensity change of the optical signal from the light source section and outputs, to the optical modulation section of the device under test, an optical test signal in which intensity change caused by change of the optical frequency is restricted;

an optical jitter generating section that delays the optical test signal passed by the optical modulation section by a delay amount corresponding to the optical frequency, to apply jitter corresponding to the optical frequency to the optical test signal; and an optical interface that transmits a plurality of optical signals output by the light source section and the optical jitter generating section to optical input sections of the device under test, receives an optical signal output by the device under test, and outputs the received optical signal, wherein the optical intensity adjusting section amplifies input light with an amplification factor corresponding to an intensity control signal having an inverse phase of the frequency control signal, and outputs the resulting optical signal.

26. A test apparatus that tests a device under test including an optical modulation section that modulates an input optical signal according to a designated pulse pattern, the test apparatus comprising:

a light source section that outputs, to the optical modulation section of the device under test, an test optical signal having an optical frequency corresponding to a frequency control signal;

an optical jitter generating section that delays the optical test signal passed by the optical modulation section by a delay amount corresponding to the optical frequency, to apply jitter corresponding to the optical frequency to the optical test signal;

an optical interface that transmits a plurality of optical signals output by the light source section and the optical jitter generating section to optical input sections of the device under test, receives an optical signal output by the device under test, and outputs the received optical signal; and a switching section that switches whether the optical frequency of the optical signal output by the light source section corresponds to the frequency control signal.

27. The test apparatus according to claim 26, wherein the light source section includes:

a laser light source section that outputs laser light having an optical frequency corresponding to the frequency control signal; and a light source driving section that drives the laser light source section, the light source driving section including a control signal generating section that outputs the frequency control signal, and wherein the switching section is provided between the laser light source section and the control signal generating section.

28. A test apparatus that tests a device under test including a device light source and an optical modulation section for modulating an optical signal input thereto according to a designated pulse pattern, the test apparatus comprising:

a light source driving section that applies a modulated drive current to the device light source, such that the device light source outputs an optical signal having an optical frequency corresponding to a frequency control signal;

an optical intensity adjusting section that receives an optical test signal obtained as a result of the modulating by the optical modulation section, compensates for optical intensity change of the received optical test signal and outputs an optical signal in which intensity change caused by change of the optical frequency is restricted;

an optical jitter generating section that delays the optical test signal output by the optical intensity adjusting section, according to the optical frequency, to apply jitter corresponding to the optical frequency to the optical test signal output by the optical intensity adjusting section; and an optical interface that transmits the plurality of optical test signals output by the optical jitter generating section to optical input sections of the device under test, receives the optical test signal output by the device under test, and outputs the received optical test signal, wherein the optical intensity adjusting section amplifies the optical test signal with an amplification factor corresponding to an intensity control signal having an inverse phase of the frequency control signal, and outputs the resulting optical signal.

29. A test apparatus that tests a device under test including a device light source and an optical modulation section for modulating an optical signal input thereto according to a designated pulse pattern, the test apparatus comprising:

a light source driving section that applies a modulated drive current to the device light source, such that the device light source outputs an optical signal having an optical frequency corresponding to a frequency control signal;

an optical jitter generating section that delays an optical test signal obtained as a result of the optical modulation section modulating and outputting the optical test signal from the device light source, according to the optical frequency;

an optical interface that transmits a plurality of optical test signals output by the optical jitter generating section to optical input sections of the device under test, receives an optical test signal output by the device under test, and outputs the received optical test signal; and a switching section that switches whether the optical frequency of the optical signal output by the light source section corresponds to the frequency control signal.

30. The test apparatus according to claim 29,
wherein the light source section includes:
a laser light source section that outputs laser light having an optical frequency corresponding to the frequency control signal; and
a light source driving section that drives the laser light source section, the light source driving section including a control signal generating section that outputs the frequency control signal, and
wherein the switching section is provided between the laser light source section and the control signal generating section.

* * * * *